US007260805B1

(12) United States Patent
Yan et al.

(10) Patent No.: US 7,260,805 B1
(45) Date of Patent: Aug. 21, 2007

(54) N-LEVEL DOWN HIERARCHICAL POWERGRID ANALYSIS

(75) Inventors: Kenneth Y. Yan, Fremont, CA (US); Anuj Trivedi, Sunnyvale, CA (US); Xiaoning Qi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 289 days.

(21) Appl. No.: 10/876,217

(22) Filed: Jun. 24, 2004

(51) Int. Cl.
*G06F 17/50* (2006.01)
(52) U.S. Cl. ........................................ 716/13
(58) Field of Classification Search ............... 716/4, 716/13, 14
See application file for complete search history.

(56) References Cited

U.S. PATENT DOCUMENTS 5,878,053 A * 3/1999 Koh et al. .................. 714/724
2002/0170020 A1 * 11/2002 Darden et al. ............. 716/2

OTHER PUBLICATIONS

Zhao, M et al., "Hierarchical analysis of power distribution networks", Computer-Aided Design of Integrated Circuits and Systems, IEEE Transactions on vol. 21, Issue 2, Feb. 2002 pp. 159-168□□.*

Qian, H et al., "Hierarchical random-walk algorithms for power grid analysis", Design Automation Conference, 2004. Proceedings of the ASP-DAC 2004. Asia and South Pacific Jan. 27-30, 2004 pp. 499-504□□.*

Sheehan, Bernard N., "TICER: Realizable Reduction of Extracted RC Circuits," iccad, p. 200, 1999 International Conference on Computer-Aided Design (ICCAD '99), IEEE Computer Society, Washington, D.C., 1999.

U.S. Appl. No. 10/876,218, filed Jun. 24, 2004 and naming as inventor(s) Xiaoning Qi, Anuj Trivedi and Kenneth Y. Yan.

* cited by examiner

*Primary Examiner*—Jack Chiang
*Assistant Examiner*—Brandon Bowers
(74) *Attorney, Agent, or Firm*—Dorsey & Whitney LLP

(57) ABSTRACT

Ports at which a cell served by a local powergrid is to be modeled are designated on a selected metal layer N-levels down from the topmost metal layer of the local powergrid. The cell is modeled at the designated ports, excluding any metal layers above the selected metal layer. Any metal layers of the local powergrid above the selected metal layer are included as part of a model of the global powergrid, rather than as part of the local powergrid, and a hierarchical powergrid analysis is performed.

37 Claims, 4 Drawing Sheets

N-LEVEL DOWN HIERARCHICAL POWERGRID ANALYSIS

CROSS-REFERENCE TO RELATED APPLICATION(S)

This application is related to application Ser. No. 10/876,218, entitled, "METHOD OF MODELING CIRCUIT CELLS FOR POWERGRID ANALYSIS", naming Xiaoning Qi, Anuj Trivedi and Kenneth Y. Yan as inventors, filed of even date and of common assignee herewith.

BACKGROUND

1. Field of the Invention

This invention relates generally to performing powergrid analysis, and more particularly to choosing port locations for hierarchical powergrid analysis.

2. Description of the Related Art

Performing electromigration (EM) risk and voltage (IR) drop analyses of a full-chip powergrid are important steps in designing modern processors and other semiconductor devices. Many of these semiconductor devices, however, have so many circuit elements that including every circuit element in a full powergrid analysis can be impractical. To address this issue, circuit designers sometimes employ hierarchical powergrid analysis.

In hierarchical powergrid analysis, a semiconductor device's powergrid is divided into a global grid and a number of local grids, with each local grid providing power and/or signal routing internally to respective circuit portions of the semiconductor device. Both the global and local grids are generally designed to be constructed from metal layers during the semiconductor fabrication process. The metal layers forming the local grids (usually the lower metal layers) are used to interconnect groups of circuit elements in a particular area, and to provide internal power and signal routing within the group of circuit elements. The metal layers forming the global grids (usually the higher metal layers) connect the local grids and are used to provide inter-group signal and power connections.

Since a large part of the complexity involved in hierarchical powergrid analysis lies in the circuit portions served by local powergrids, the local powergrids are analyzed first. Each local analysis is generally performed by fixing one or more sites on the highest metal layer of a respective local powergrid to use as ports for connecting the local powergrid to the lowest metal layer of the global powergrid. Since powergrids are traditionally designed without ports to connect local and global powergrids, ports are defined based on local cell placement coordinates and orientation of the local cells, which implies that the highest metal of the local powergrid and the lowest metal of the powergrid will be touching at those points.

Each of the circuit portions is characterized at respective ports to obtain reduced complexity models of the circuit portions, e.g. cells served by the local powergrid. These models also usually take into account the local powergrid itself. The reduced-complexity model of each local cell is then incorporated into the global powergrid at the ports, and a global powergrid analysis is performed.

A drawback of some conventional hierarchical analysis techniques is that if a designer performs a global powergrid analysis during earlier stages of the design cycle, the exact location of the ports between the local and global powergrids may not have been fixed yet. Choosing the port locations for hierarchical powergrid analysis effectively fixes the ports at the chosen locations. Consequently, an inopportune selection of port locations can have adverse consequences on the overall circuit design, and any changes to the global powergrid design that might affect the location of the ports become problematic.

SUMMARY

As used herein, the term "local cell" refers generally to a portion of a semiconductor circuit that is modeled as a unit, independent of other portions of the semiconductor circuit. Such an independent circuit portion may include a library cell, a block, a metacell, etc. A "local powergrid" refers, generally, to a collection of metal layers serving a local cell. The term "global powergrid" is used to refer, generally, to one or more metal layers carrying power and/or signals to two or more local cells. While the boundary between local and global powergrids is somewhat flexible, in most cases, as many of the metal layers as practical are included in the local grid to reduce the complexity of global powergrid analysis.

A metal layer of a local powergrid, other than the topmost metal layer of the local powergrid, is selected as the layer at which a circuit portion, e.g. a cell, is to be characterized for hierarchical powergrid analysis. At the time the metal layer is selected, there is a known site of connection between the selected metal layer and a higher level local metal layer. This known site of electrical connection is assumed, for purposes of the hierarchical analysis, to be a port between the local powergrid and a global powergrid, even though the ultimate location of the ports between the local powergrid and the global powergrid may not yet be determined. Selecting a metal layer with fixed connections to the higher level local metal layer can provide, among other things, flexibility to allow changes in the placement of higher level local metal layers, and improved efficiency in determining port locations for analysis purposes.

In at least one embodiment, a method includes identifying a first local metal layer of a local powergrid. The first local metal layer corresponds to a local metal layer lower than a topmost local metal layer of the local powergrid (e.g. "N-levels down"), and includes a known site of electrical contact to a higher level metal layer. The method also includes performing a local powergrid analysis treating the selected local metal layer as part of the local powergrid and treating local metal layers higher than the selected local metal layer, including the topmost local metal layer, as part of a global powergrid. The results of the local powergrid analysis may then be used to perform a global powergrid analysis. In various embodiments, the known site of electrical contact may be one or more vias, or a location where the selected local metal abuts a metal layer that is part of another powergrid, e.g. a powergrid local to another cell or a global powergrid.

Other embodiments include a semiconductor device constructed using a form of hierarchical powergrid analysis that includes selecting a metal layer of a local powergrid, lower than the topmost metal layer of the local powergrid (e.g. "N-levels down"), at which to characterize a circuit portion. Yet further embodiments include a system for performing hierarchical powergrid analysis of semiconductor circuits, and a method of making a computer readable medium product that encodes an integrated circuit design. The circuit design is generated using a method including performing a hierarchical powergrid analysis as described herein. The design is then encoded onto a computer readable medium product.

BRIEF DESCRIPTION OF THE DRAWINGS

The present invention may be better understood, and its numerous objects, features, and advantages made apparent to those skilled in the art, by referencing the accompanying drawings.

The use of the same reference symbols in different drawings indicates similar or identical items.

DESCRIPTION OF THE PREFERRED EMBODIMENT(S)

Figure 1:
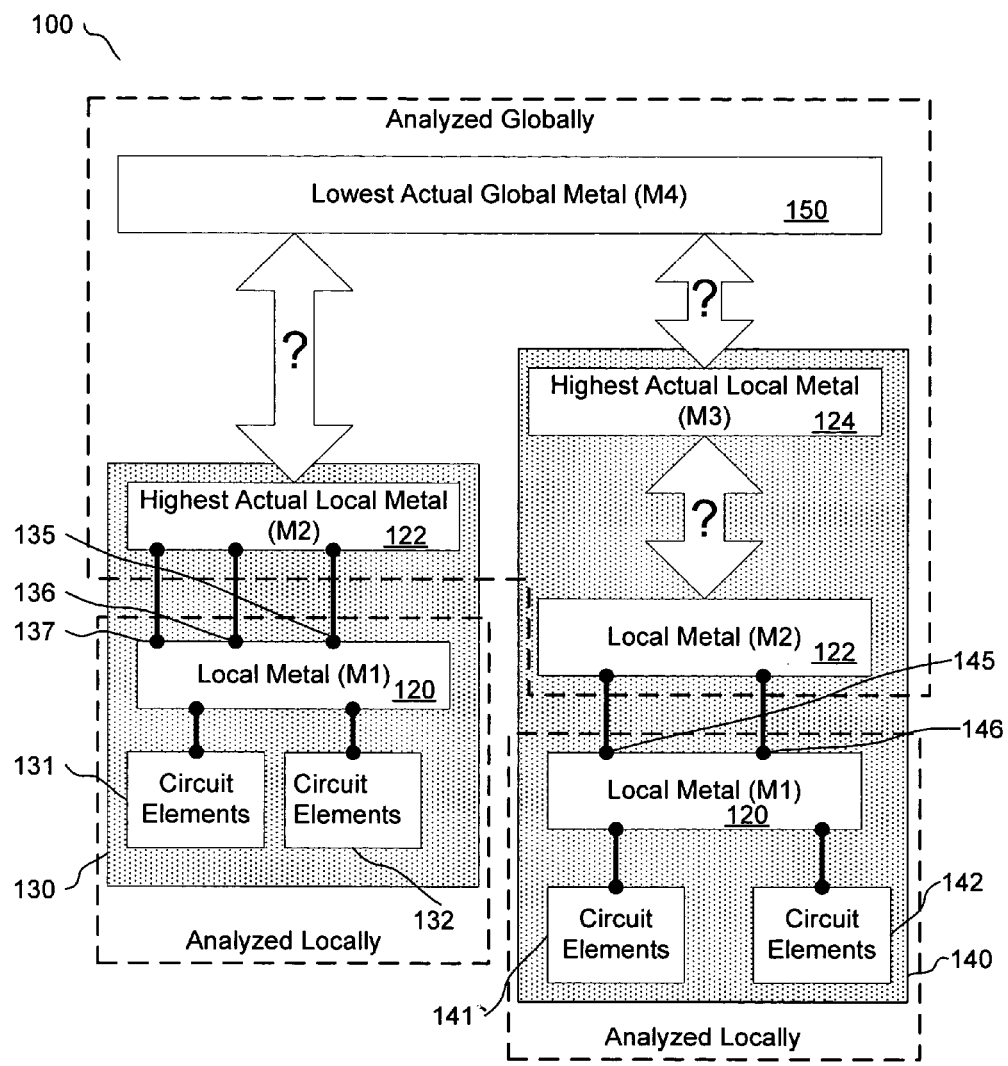
FIG. 1 is a diagram illustrating how circuit portions are groups for hierarchical power grid analysis according to an embodiment of the present invention.

Referring first to FIG. 1, techniques for grouping power grids for hierarchical analysis will be discussed according to an embodiment of the present invention. As known to those skilled in the art, semiconductor structures such as transistors, capacitors, diodes, and the like are often placed on a semiconductor substrate so that functionally related structures are located close to each other. These groups of functionally related semiconductor structures, or circuit elements, are sometimes referred to as cells.

The circuit elements within cells are usually interconnected by one or more metal layers, which are used to route signals and power to individual circuit elements. The metal layers used to interconnect circuit elements internal to a cell are commonly referred to as local power grids. It should be noted, however, that the term "local power grid" sometimes includes not only the interconnecting metal layers, but also the circuit elements connected by the metal layers. Each of the cells is connected to other cells by one or more additional metal layers that form a global power grid. As the name implies, global power grids distribute power globally, e.g. to each of the local power grids.

FIG. 1 shows a highly simplified semiconductor device, referred to generally as circuit 100. Circuit 100 includes cell 130 and cell 140 to be connected by global metal layer 150. Cell 130 includes circuit elements 131 and 132, and local metal layers 120 and 122. Cell 140 includes circuit elements 141 and 142, and metal layers 120, 122, and 124.

Circuit 100 is illustrated at a stage in the design process when not all the connections between the various metal layers are known. For example, although connection sites between circuit elements 131, 132 and local metal layer 120 are known, and connection sites between local metal layer 120 and local metal layer 122 are known, it is not yet determined where global metal layer 150 will be connected to local metal layer 122 of cell 130. Likewise, connection sites between circuit elements 141, 142 and local metal layer 120, as well as connection sites between local metal layer 120 and local metal layer 122 are known for cell 140. Connection sites between local metal layer 122 and local metal layer 124 within cell 140 are, however, unknown. Additionally, connection sites between global metal layer 150 and local metal layer 124 of cell 140 are not yet known.

If all the connection sites, sometimes referred to as ports, were known, a hierarchical power grid analysis would be preformed by characterizing cells 130 and 140 at ports on metal layer 122 and 124, respectively. A global power grid analysis would be preformed as if the cell characterizations were a part of a global circuit.

Since the connection points between metal layers 122, 124 and 150 are not yet known, however, cells 130 and 140 cannot be characterized at metal layers 122 or 140, respectively. If conventional hierarchical analysis were to be performed at this stage, eventual port locations would need to be predicted, and possibly fixed. Fixing port locations at this stage could limit design choices better made during later stages of the circuit design process. Thus, in at least one embodiment of the present invention, predictions regarding future port placement are not required.

As noted previously, hierarchical power grid analysis generally involves first characterizing and analyzing multiple local power grids, and then using those results to perform a combined global power grid analysis. In at least one embodiment of the present invention, an N-level down local power grid analysis is performed. For example, rather than performing the local power grid analysis for the entire cell 130, including local metal layer 122, a local power grid analysis is performed one level down, in effect moving the highest actual local metal layer 122 into the global power grid analysis. Since the ports between local metal layer 120 and local metal layer 122 have already been fixed, treating local metal layer 122 as part of the global power grid provides the necessary fixed port locations so that characterized portions of cell 130 can be used in a hierarchical powergrid analysis.

Consider the following, more specific example: Circuit elements 141 and 142 of cell 140 have known connection sites to local metal layer 120, which in turn, has known connection sites to local metal layer 122. The location of ports between local metal layer 122 and local metal layer 124 within cell 140 are unknown, as are the location of ports connecting local metal layer 124 to global metal layer 150. Thus, according to an embodiment of the present invention, circuit elements 141 and 142 would be characterized at ports 145 and 146. Thus, local metal layer 120 and everything at a lower level is included in the local powergrid analysis, while everything above metal layer 120 is treated as part of the global powergrid.

Likewise, a local power grid analysis of cell 130 would be performed at the level of local metal layer 120, and circuit elements 131 and 132 would be characterized at ports 135, 136 and 137. Note that in characterizing cells 130 and 140, the entire local power grid of each cell has not been characterized; the uppermost portions of each local power grid are treated as part of the global power grid. Results of the local analysis, performed N-levels down from the topmost local metal layers of both cells 130 and 140 can then be used for the global power grid analysis.

Figure 2:
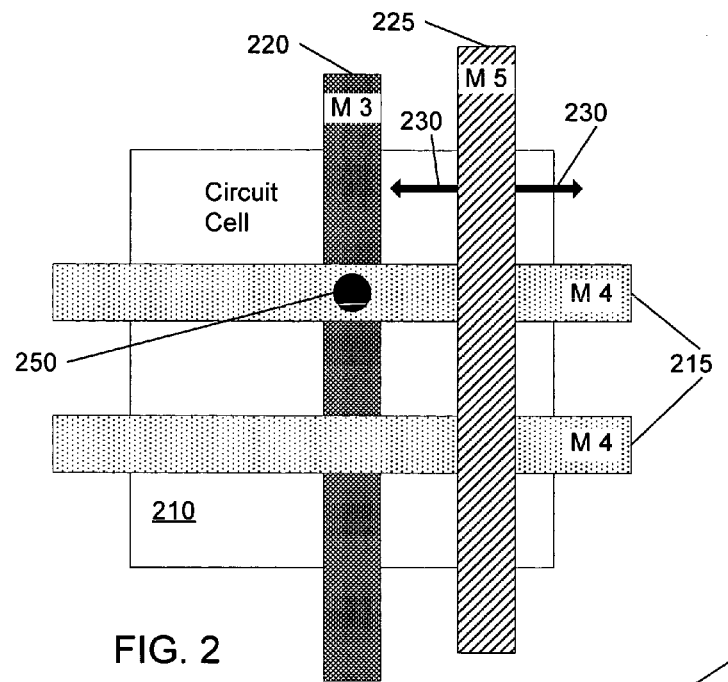
FIGS. 2 and 3 are diagrams illustrating various methods of connecting global grids to local grids according to various embodiments of the present invention.

Referring next to FIG. 2, an example of how various metal layers may be connected is illustrated to show how ports can be chosen N-levels down according to an embodiment of the present invention. FIG. 2 illustrates circuit cell 210, which includes various circuit elements served via a local power grid. Interconnections between circuit elements within circuit cell 210 are made using, for example, metal 3 (M3) layer 220 and metal 4 (M4) layer 215. The metal 5 (M5) layer 225 is, in this example, part of a global power grid interconnecting circuit cell 210 with other circuit cells (not illustrated). As illustrated by arrows 230, the placement of M5 layer 225 has not yet been fixed by design, thus M5 layer 225 may be positioned to the left or to the right of the position illustrated in FIG. 2 as shown by arrows 230.

Consequently, there is no fixed location at which to characterized circuit cell 210 for a conventional hierarchical power grid analysis. Note, however, that at this site of the circuit design, the location of via 250 is a fixed, providing a fixed connection site between circuit cell 210, M3 layer 220 and M4 layer 215. In at least one embodiment, therefore, M4 layer 215 is treated as a global metal layer for purposes of power grid analysis, thereby providing a fixed port, e.g. via 250, at which circuit cell 210 may be characterized.

Figure 3:
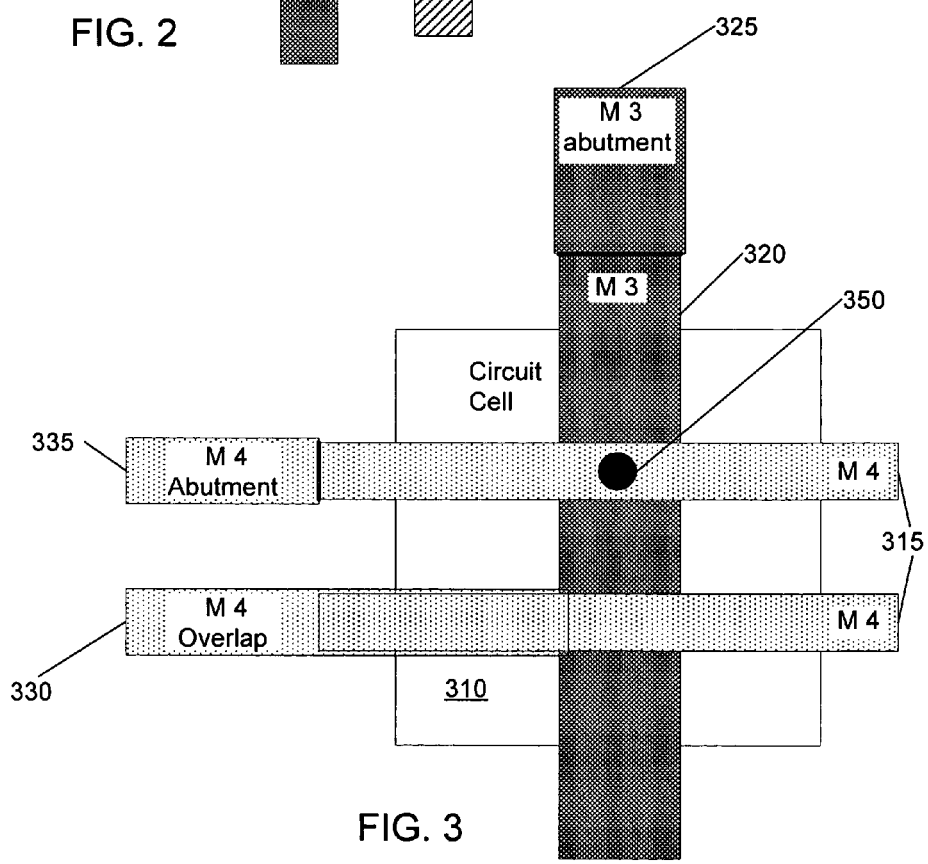

FIG. 3 illustrates other possible connections between metal layers that may be used as fixed port locations during an N-level down hierarchical power grid analysis. Note that in FIG. 3, the M3 layer 320, which forms part of the local power grid for circuit cell 310, may be used as a connection site to a global power grid by abutting M3 abutment 325 to the portion of M3 layer 320 used within the local power grid of circuit cell 310. Likewise, M4 abutment 335 or M4 overlap 330 may be used to connect the local power grid of circuit cell 310 to a global power grid. If the locations of M3 abutment 325, M4 abutment 335, or M4 overlap 330 are known at the time hierarchical power grid analysis is being performed, the abutments or the overlap may be chosen as fixed port locations at which to characterize circuit cell 310. If these locations are not known, however, via 350 may still be used as a fixed port in the same manner as via 250 (FIG. 2) was used. While not illustrated, it should also be appreciated that multiple vias in relatively close proximity to each other, sometimes referred to as via arrays, may be lumped together and defined as single ports. Additionally, some combination of abutments, overlaps, vias, or the like may each be designated as ports in some embodiments.

Figure 4:
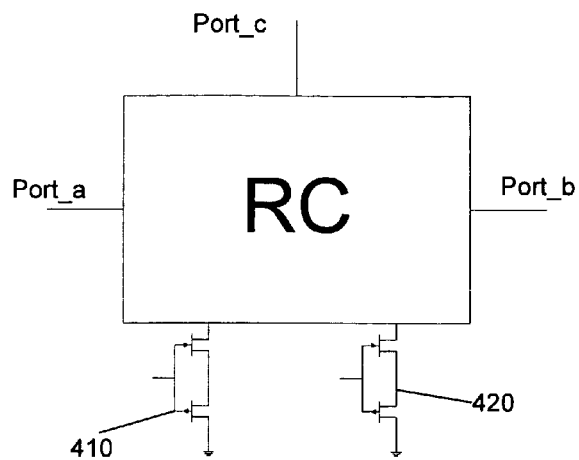
FIGS. 4-6 illustrate a series of stages during characterization of a local circuit for use in hierarchical power grid analysis.
Figure 5:
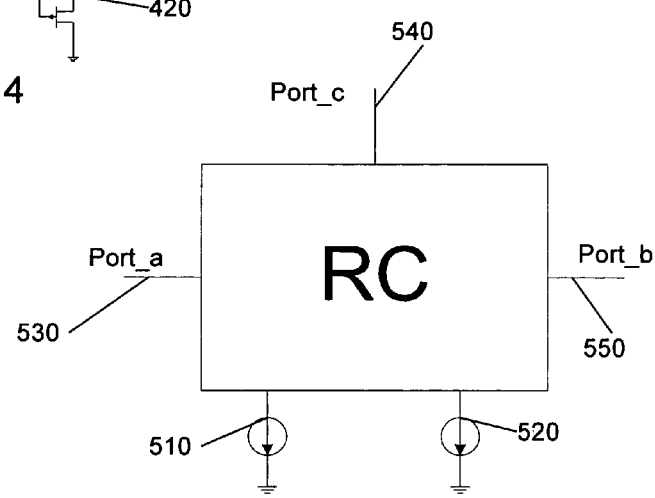
Figure 6:
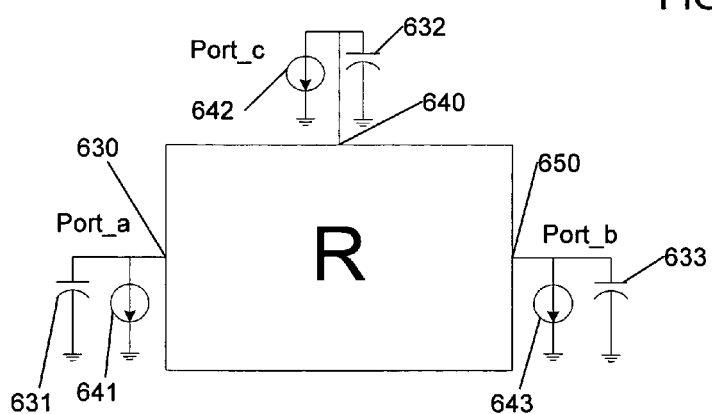

Referring next to FIGS. 4-6, characterization of circuit cells will be discussed according to an embodiment of the present invention. FIG. 4 illustrates a circuit cell 400 having three known port locations determined N-levels down as previously discussed. Circuit cell 400 can be modeled as an RC network connected to circuit elements 410 and 420. Circuit elements 410 and 420 can be further modeled as current sources 510 and 520 as shown in FIG. 5. Using Thevenin's theorem and superposition, the amounts of current flowing through each of the three ports 530, 540 and 550 from current sources 510 and 520 can be calculated. Likewise, the capacitance seen at each of the ports 530, 540, and 550 can be determined.

FIG. 6 illustrates a model of circuit cell 400 reduced to a resistive network R having three ports 630, 640, and 650, with each port being connected to a capacitor 631, 632, or 633 and a current source 641, 642, or 643 respectively. The process of modeling a circuit cell at its ports, as discussed briefly here, is discussed more fully in U.S. patent application Ser. No. 10/876,218, entitled "METHOD OF MODELING CIRCUIT CELLS FOR POWERGRID ANALYSIS", naming Xiaoning Qi, Anuj Trivedi and Kenneth Y. Yan as inventors, filed of even date herewith, and hereby incorporated herein by reference in its entirety. Once each circuit cell has been characterized at its ports, the cell characterizations may be included in the global power grid for global power grid analysis. Recall that the global power grid analysis may be performed as if at least one of the metal layers actually included in a cell's local power grid were instead part of the global power grid.

Figure 7:
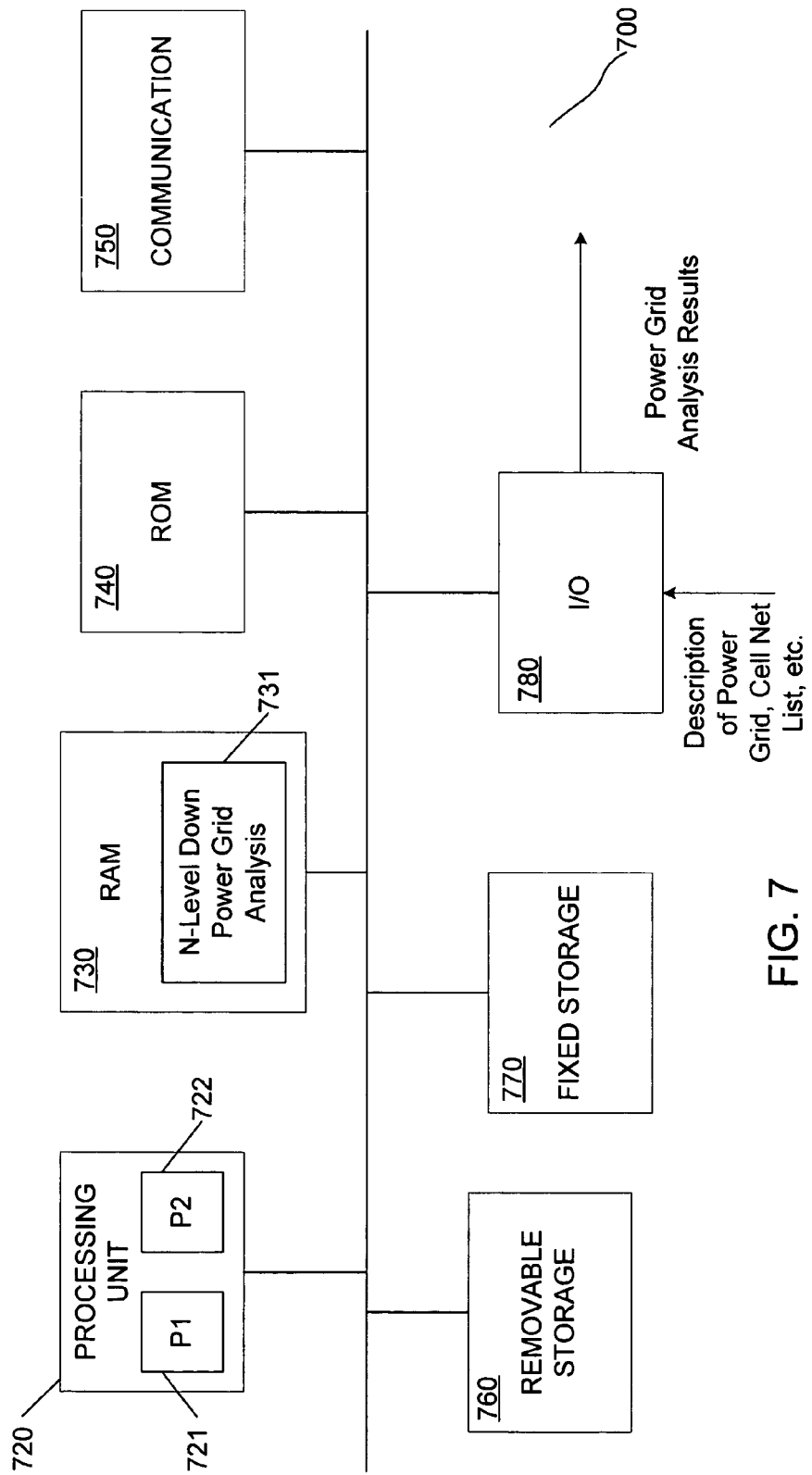
FIG. 7 is a block diagram illustrating a processing system according to an embodiment of the present invention.

Referring next to FIG. 7, a processor suitable for use in implementing a program of executable instructions on a computer readable medium according to various embodiments of the present invention is discussed. As will be appreciated, the term "computer readable medium" encompasses memory devices such as various forms of computer memory, including for example, random access memory (RAM) and read only memory (ROM), electromagnetic disk drives, optical drives, various forms of propagated signals, magnetic tapes, optical tapes, paper tapes, and any similar medium used in transporting or storing computer readable information.

The data processor 700 illustrated in FIG. 7 includes a number of devices connected to a common system bus 710. Processing unit 720 includes one or more devices and/or processing cores 721 and 722, sometimes referred to as central processing units (CPUs) that obtain information to be processed, such as a power grid description, cell netlist, etc., over system bus 710, process the information, and output results, such as a cell model, to one of the connected devices. RAM 730 and/or ROM 740 store programs and/or data, for example N-level down powergrid analysis instructions 731, for execution by processing unit 720. Removable storage 760 may include storage devices having removable media, such as floppy disks, compact disks, tape drives, memory sticks, and the like. Fixed storage 770 includes such devices as hard disk drives and the like that do not have removable media. Generally, both removable storage 760 and fixed storage 770 are used for bulk storage of information and/or programs. The information and programs stored in fixed storage 770 and removable storage 760 are usually copied to RAM 730 for faster access by processing unit 720. Finally, communications device 750 includes network interface cards, modulator/demodulators (modems), and the like, while input output unit (I/O) 780 includes devices such as keyboards, speakers, monitors, and pointing devices.

Although various embodiments of the present invention have been shown and described in detail herein, many other varied embodiments of the present invention may be practiced without departing from the teachings set forth herein. These embodiments can be readily constructed by those skilled in the art. Accordingly, the present invention is not intended to be limited to the specific forms set forth herein, but to the contrary, include such alternatives, modifications, and equivalents as can be reasonably included within the spirit and scope of the invention.

What is claimed is:

1. A computer implemented method of performing a powergrid analysis of an integrated circuit design when some connection sites are unknown comprising:

selecting a local metal layer of a first cell lower than a topmost local metal layer of the first cell, the selected local metal having known sites of electrical contact with a higher local metal layer of the first cell;

selecting a topmost local metal layer of a second cell, the topmost layer of the second cell having known sites of electrical contact with a global metal layer;

designating the known sites of electrical contact on the selected local metal layer of the first cell and the known sites of electrical contact on the topmost metal layer of the second cell as ports at which to model the first cell and the second cell, respectively, thereby substantially excluding designating unknown sites of electrical contact as ports;

performing a powergrid analysis; and providing the powergrid analysis of the integrated circuit design.

2. The computer implemented method of claim 1 further comprising performing a global powergrid analysis, wherein the topmost local metal layer of the first cell is included in a model of the global powergrid, and not included in a model of the local powergrid.

3. The computer implemented method of claim 2 wherein a plurality of local metal layers above the selected local metal layer of the first cell are included in the model of the global powergrid, and not included in the model of the local powergrid.

4. The computer implemented method of claim 1 wherein one or more of the known sites of electrical contact includes one or more vias.

5. The computer implemented method of claim 1 wherein the selected local metal layer includes a known site of electrical contact with a local metal layer of another cell.

6. The computer implemented method of claim 5 wherein the known site of electrical contact includes an abutment.

7. The computer implemented method of claim 5 wherein the known site of electrical contact includes an overlap.

8. A computer implemented method of performing a powergrid analysis of an integrated circuit design when some connection sites are unknown comprising:
   identifying, during a semiconductor design process, a first circuit portion of a semiconductor to be modeled for powergrid analysis, wherein the first circuit portion is to be modeled independently from a second circuit portion of the semiconductor;
   identifying a first local metal layer of the first circuit portion as having a known site of electrical contact with a second local metal layer of the first circuit portion,
   wherein the first and second metal layer are to provide at least power distribution within the first circuit portion,
   wherein the second metal layer is a higher level metal layer than the first metal layer, and
   wherein at least one site of electrical contact between the second metal layer and a third metal layer has yet to be determined, the third metal layer being a global metal layer to provided power to both the first circuit portion and the second circuit portion;
   defining the known site of electrical contact between the first and second local metal layers as a port between a local powergrid of the first circuit portion and a global powergrid, thereby substantially excluding defining unknown sites of electrical contact as ports; performing a powergrid analysis; and
   powergrid analysis of the integrated circuit design.

9. The computer implemented method of claim 8 wherein the second circuit portion includes a topmost local metal layer having known points of electrical contact with the third metal layer, and further including defining the known points of electrical contact on the topmost metal layer of the second circuit portion as ports between a local powergrid of the second circuit portion and the global powergrid.

10. The computer implemented method of claim 8 further including:
   generating a model of the first circuit portion at the defined port.

11. The computer implemented method of claim 10 further comprising:
   performing the powergrid analysis using the generated model.

12. The computer implemented method of claim 8 wherein the known site of electrical contact includes one or more vias.

13. The computer implemented method of claim 8 wherein the first local metal layer includes a known site of electrical contact to a local metal layer of the second circuit portion.

14. The computer implemented method of claim 13 wherein the known site of electrical contact includes an abutment.

15. The computer implemented method of claim 13 wherein the known site of electrical contact includes an overlap.

16. The computer implemented method of claim 8 wherein at least one of the first metal layer, the second metal layer, or the third metal layer corresponds to a metal layer other than an M1 metal layer, an M2 metal layer, or an M3 metal layer, respectively.

17. A computer implemented method of performing a powergrid analysis of an integrated circuit design when some connection sites are unknown comprising:
   designating a known site of electrical contact between a topmost local metal layer of a first circuit portion and a first global metal layer as a port at which the first circuit portion is to be characterized for powergrid analysis;
   designating a known site of electrical contact between a lower local metal layer of a second circuit portion and a topmost local metal layer of the second circuit portion as a port at which the second circuit portion is to be characterized for powergrid analysis, thereby substantially excluding designating unknown sites of electrical contact as ports;
   performing a global powergrid analysis, wherein the topmost local metal layer of the second circuit portion is modeled as part of the global powergrid and the topmost local metal layer of the first circuit portion is modeled as part of the global powergrid; and
   providing the powergrid analysis of the integrated circuit design.

18. The computer implemented method of claim 17 wherein the known site of electrical contact includes one or more vias.

19. The computer implemented method of claim 17 wherein the lower local metal layer of the second circuit portion includes a known site of electrical contact to a local metal layer of another circuit portion.

20. The computer implemented method of claim 19 wherein the known site of electrical contact includes an abutment.

21. The computer implemented method of claim 19 wherein the known site of electrical contact includes an overlap.

22. A method of performing a powergrid analysis of an integrated circuit design when some connection sites are unknown comprising:
   selecting a local metal layer of a first cell, the selected lower metal layer being lower than a topmost local metal layer of the first cell and having known sites of electrical contact with a higher local metal layer of the first cell;
   selecting a topmost local metal layer of a second cell, the topmost layer of the second cell having known sites of electrical contact with a global metal layer;
   designating the known sites of electrical contact between the selected local metal layer of the first and second cells and the higher local metal layer as ports at which to model the local powergrid, thereby substantially excluding designating unknown sites of electrical contact as ports performing a global powergrid analysis; and
   providing the powergrid analysis of the integrated circuit design.

23. The method of claim 22 wherein the topmost local metal layer of the cell is included in a model of the global powergrid, and not included in a model of the local powergrid.

24. The method of claim 22 wherein the method further comprises:
    wherein a plurality of local metal layers above the selected local metal layer are included in the model of the global powergrid, and not included in the model of the local powergrid.

25. The method of claim 22 wherein the method further comprises modeling the cell at the ports and providing a result thereof.

26. The method of claim 22 wherein one or more of the known sites of electrical contact include one or more vias.

27. The method claim 22 wherein the selected local metal layer includes a known site of electrical contact with a local metal layer of another cell.

28. The method claim 27 wherein the known site of electrical contact includes an abutment.

29. The method of claim 27 wherein the known site of electrical contact includes an overlap.

30. A method of performing a powergrid analysis of an integrated circuit design when some connection sites are unknown comprising:
    selecting a metal layer of a local powergrid at which to characterize a circuit cell for powergrid analysis, the selected metal layer corresponding to a local metal layer lower than a topmost local metal layer;
    designating the known sites of electrical contact between the selected local metal layer and the topmost local metal layer as ports at which to model the local powergrid, thereby substantially excluding designating unknown sites of electrical contact as ports;
    performing a powergrid analysis treating at least the topmost local metal layer as part of a global powergrid, and not as part of the local powergrid; and
    providing the powergrid analysis of the integrated circuit design.

31. The method of claim 30 wherein the selecting a metal layer includes selecting a local metal layer having a known site of electrical contact with a higher level local metal layer.

32. The method of claim 31 further comprising modeling the circuit cell at the known site of electrical contact.

33. The method of claim 31 wherein the performing a powergrid analysis includes using the known site of electrical contact as a port between the local powergrid and the global powergrid.

34. A machine-readable medium including sets of executable instructions which, when executed by a machine, cause the machine to:
    select a local metal layer of a cell lower than a topmost local metal layer of the cell and having known sites of electrical contact with a higher local metal layer of the cell;
    designate the known sites of electrical contact between the selected local metal layer and the higher local metal layer as ports at which to model the local powergrid, thereby substantially excluding designating unknown sites of electrical contact as ports perform a powergrid analysis; and
    provide the powergrid analysis of the integrated circuit design.

35. The machine-readable medium product of claim 34, wherein the sets of instructions when executed by the machine, further cause the machine to perform a global powergrid analysis, wherein at least the topmost local metal layer is included in a model of the global powergrid, and not included in a model of the local powergrid.

36. The machine-readable medium of claim 34, wherein the sets of executable instructions when executed by the machine, further cause the machine to perform a global powergrid analysis wherein a plurality of local metal layers above the selected local metal layer are included in the model of the global powergrid, and not included in the model of the local powergrid.

37. The machine-readable medium of claim 36, wherein the sets of executable instructions when executed by the machine, further cause the machine to characterize the cell at the known site of electrical contact and provide a result thereof.

* * * * *